United States Patent
Chen et al.

(10) Patent No.: US 9,117,763 B1
(45) Date of Patent: Aug. 25, 2015

(54) QUANTUM DOTS (QD) FOR SEMICONDUCTOR INTEGRATED CIRCUIT

(71) Applicant: HRL LABORATORIES, LLC, Malibu, CA (US)

(72) Inventors: Mary Y. Chen, Oak Park, CA (US); Peter W. Deelman, Calabasas, CA (US); Marko Sokolich, Los Angeles, CA (US)

(73) Assignee: HRL Laboratories, LLC, Malibu, CA (US)

( * ) Notice: Subject to any disclaimer, the term of this patent is extended or adjusted under 35 U.S.C. 154(b) by 158 days.

(21) Appl. No.: 14/028,197

(22) Filed: Sep. 16, 2013

Related U.S. Application Data

(62) Division of application No. 11/542,814, filed on Oct. 3, 2006, now Pat. No. 8,595,654.

(51) Int. Cl.
*G06F 17/50* (2006.01)
*H01L 21/308* (2006.01)

(52) U.S. Cl.
CPC .............. *H01L 21/308* (2013.01); *G06F 17/50* (2013.01)

(58) Field of Classification Search
CPC .................................................... H01L 23/544
See application file for complete search history.

(56) References Cited

U.S. PATENT DOCUMENTS

| | | | |
|---|---|---|---|
| 5,543,354 A * | 8/1996 | Richard et al. ................. 117/89 |
| 6,546,031 B1 | 4/2003 | Jewell et al. | |
| 6,579,463 B1 | 6/2003 | Winningham et al. | |
| 6,633,370 B2 | 10/2003 | Lawandy et al. | |
| 6,819,845 B2 | 11/2004 | Lee et al. | |
| 6,942,731 B2 | 9/2005 | Sellin et al. | |
| 7,005,669 B1 | 2/2006 | Lee et al. | |
| 7,005,696 B2 | 2/2006 | Yih et al. | |
| 7,257,143 B2 | 8/2007 | Johnson et al. | |
| 7,700,937 B2 | 4/2010 | Hirose et al. | |
| 7,745,813 B2 | 6/2010 | Samuelson et al. | |
| 8,595,654 B1 | 11/2013 | Chen et al. | |
| 2003/0047752 A1 * | 3/2003 | Campbell et al. ............. 257/186 |
| 2004/0080732 A1 * | 4/2004 | Kuroda et al. ................. 355/53 |
| 2007/0131853 A1 * | 6/2007 | Chua et al. ............... 250/231.13 |
| 2007/0153277 A1 * | 7/2007 | Shakespeare et al. ........ 356/402 |

OTHER PUBLICATIONS

Hess, H.F., et al., "Near-Field Spectroscopy of the Quantum Constituents of a Luminescent System", Science, vol. 264, pp. 1740-1745 (Jun. 17, 1994).

Bimberg, Grundmann, and Ledenstov, "Quantum Dot Heterostructures" pp. 1-4 (1998).

Yuan et. al., "Electrically Driven Single-Photon Source", Science, vol. 295, pp. 101-105 (Jan. 4, 2002).

From U.S. Appl. No. 11/452,814 (now U. S. Patent No. 8,595,654), Restriction Requirement dated Apr. 2, 2009.

From U.S. Appl. No. 11/452,814 (now U.S. Patent No. 8,595,654), Office Action dated Jul. 15, 2009.

(Continued)

*Primary Examiner* — Angel Roman
(74) *Attorney, Agent, or Firm* — Ladas & Parry

(57) ABSTRACT

Semiconductor device identification using quantum dot technology. A semiconductor nanocrystal based target is fabricated. A guard ring superjacent the fluorescing surface of the nanocrystal surface is provided to ensure repeatability of spectral mapping and analysis data. A transparent cap on the target may enhance performance. A system for coding a semiconductor device is described. A method is described for fabricating quantum dot targets in a methodology compatible with subsequent semiconductor fabrication process steps.

10 Claims, 6 Drawing Sheets

(56) References Cited

OTHER PUBLICATIONS

From U.S. Appl. No. 11/452,814 (now U.S. Patent No. 8,595,654), Office Action dated Jan. 19, 2010.
From U.S. Appl. No. 11/452,814 (now U.S. Patent No. 8,595,654), Office Action dated Jul. 8, 2010.
From U.S. Appl. No. 11/452,814 (now U.S. Patent No. 8,595,654), Office Action dated Feb. 2, 2011.
From U.S. Appl. No. 11/452,814 (now U.S. Patent No. 8,595,654), Office Action dated Jun. 7, 2011.
From U.S. Appl. No. 11/452,814 (now U.S. Patent No. 8,595,654), Restriction Requirement dated Nov. 9, 2011.
From U.S. Appl. No. 11/452,814 (now U.S. Patent No. 8,595,654), Office Action dated Mar. 30, 2012.
From U.S. Appl. No. 11/452,814 (now U.S. Patent No. 8,595,654), Final Office Action dated Sep. 19, 2012.
From U.S. Appl. No. 11/452,814 (now U.S. Patent No. 8,595,654), Notice of Allowance dated Jul. 23, 2012.

\* cited by examiner

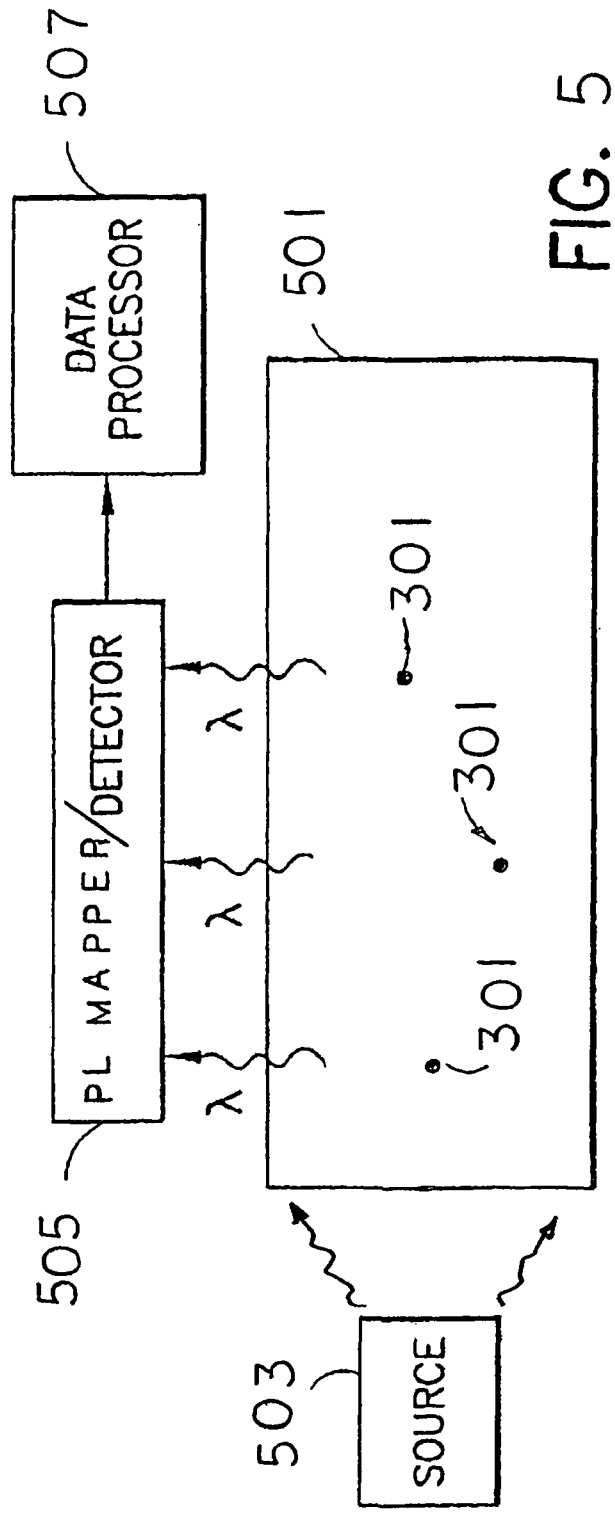

QUANTUM DOTS (QD) FOR SEMICONDUCTOR INTEGRATED CIRCUIT

CROSS-REFERENCE TO RELATED APPLICATIONS

This is a divisional application of U.S. patent application Ser. No. 11/542,814, filed on Oct. 3, 2006, which is incorporated herein as though set forth in full.

STATEMENT REGARDING FEDERALLY SPONSORED RESEARCH OR DEVELOPMENT

Not applicable.

REFERENCE TO AN APPENDIX

Not applicable.

FIELD

The technology described herein is generally related to the field of semiconductor devices and to the use of quantum dot technology to provide an integral, unique, reproducible identifier to be associated with each device.

BACKGROUND

A variety of technologies are used for semiconductor device identification, recognition, authentication, verification, security, and the like; for simplicity of explanation of the present invention, such issues and processes and mechanisms associated with such issues are generically referred to generically as "coding." For example, to resolve such issues in semiconductor devices—e.g., integrated circuits (ICs), inkjet printheads, nanomachines, and the like—they are often coded using mechanisms such as bar codes, distinct pattern lithographic features, encryption circuitry, tamper detection circuitry, or activation firmware programming, and the like.

Quantum dots are semiconductor crystals having a size on the order of just a few nanometers. Known manner fabrication of quantum dot constructs is described in the textbook titled "Quantum Dot Heterostructures," by D. Bimberg, M. Grundmann, and N. N. Ledentsov, copyright, John Wiley & Sons, U.K. publishers, 1998, and in U.S. Pat. No. 6,942,731 by Sellin et al. (including Bimberg, D.), titled "Method For Improving The Efficiency Of Epitaxially Produced Quantum Dot Semiconductor Components," each incorporated herein by reference.

Quantum dots structures, as in the case of the present invention, may be self-assembling, self-organized constructs that are characterized by electron, hole, or electron-hole pair confinement which results in discrete quantized energy levels and distinct spectral photoluminescence. The larger a quantum dot, the more towards the red end of the spectrum the fluorescence; the smaller the dot, the more towards the blue end. In other words, a quantum dot construct comprising many nanocrystals will exhibit a distinct luminescence spectral emission when reflected light is analyzed by known manner spectroscopy techniques. Because of the heterogenous nature of each quantum dot structure, each will have a unique spectral pattern, analogous to a "signature" or "fingerprint." See e.g., "Near-Field Spectroscopy of the Quantum Constituents of a Luminescent System," H.F. Hess et al., Science, vol. 264, 1994, pp. 1740.

In U.S. Pat. No. 6,633,370, for "Quantum Dots, Semiconductor Nanocrystals and Semiconductor Particles Used As Fluorescent Coding Elements," N.M. Lawandy discusses impediments to using quantum dots for coding, labeling and authentication applications for integrated circuits. Lawandy instead proposes using "semiconductor particles having a radius larger than a quantum dot radius for a corresponding material."

With semiconductor devices having an ever increasing complexity, continual miniaturization of the discrete components therein, and issues regarding counterfeit products, there is a need for improved semiconductor device coding technologies.

SUMMARY

The present invention generally provides for using quantum dot technology for semiconductor device coding.

In one aspect, the present invention provides an apparatus for coding a semiconductor device, the apparatus including: formed on said device, targeting mechanisms for emitting quantum dot construct photoluminescence; and associated with said targeting mechanisms, masking mechanisms for defining an outer periphery of said targeting mechanisms.

In another aspect, the present invention provides a system for coding a semiconductor substrate, the system including: on said substrate, at least one quantum dot target having a predetermined chemistry and emitting a substantially repeatable photoluminescence; positioned for illuminating each said target, an illumination source having photoemissions of a predetermined wavelength associated with said predetermined chemistry for instigating said photoluminescence; a detector positioned for receiving said photoluminescence instigated by said illumination source; associated with said detector, a photoluminescence reading and mapping subsystem for generating data records from said quantum dot photoluminescence; and a data processor for storing maps associated with said data records and for comparing said maps to subsequently received data records associated with subsequent photoluminescence emissions instigated by said illumination source.

In another aspect, the present invention provides a method for forming a quantum dot coding apparatus on a semiconductor device having a given substrate using known manner fabrication processes associated with the chemistry of said given substrate, the method having steps including: forming an etch stop layer across an active element surface of said substrate; forming a semiconductor nanocrystal layer comprising quantum dots superjacent said etch stop layer; forming at least one targeting mask superjacent said semiconductor nanocrystal layer; removing regions of said nanocrystal layer not subjacent each targeting mask; forming a via in said targeting mask, exposing a surface region of said nanocrystal layer, and forming a passivation layer superjacent said targeting mask and said surface region of said nanocrystal layer, wherein said mask and surface region of said nanocrystal layer form a target for impinging light for causing photoluminescence from said surface region of said nanocrystal layer through said via, and wherein said passivation layer protects said target from subsequent process for forming active elements of said semiconductor device in said substrate.

Some objects and advantages of the present invention are:
   self-assembled quantum dot constructs have good crystalline quality and a protective interface;
   it is relatively simple as compared with other authentication or verification techniques;
   it has no electrical nor optical functions related to the device upon which it is mounted and therefore does not affect performance of device;

associated identity authentication, or decoding, processes do not depend on detection of a response which is related to functions of the device upon which it is attached;

because growth temperature of quantum dot structures is generally higher than known manner semiconductor process temperature, and because of three dimensional confinement (less temperature sensitivity), quantum dot structures are stable and are not expected to change with time;

physical size of quantum dot structures make them invisible to the unaided-eye and difficult to detect even with the aid of systems such as scanning electron microscopes; and in operation, identity authentication tests do not need any bias nor need to be triggered, no modification to response in detection is needed, and physical attacks can be sensed and verified.

The foregoing summary is not intended to be inclusive of all aspects, objects, advantages and features of the present invention nor should any limitation on the scope of the invention be implied therefrom. This Brief Summary is provided in accordance with the mandate of 37 C.F.R. 1.73 and M.P.E.P. 608.01(d) merely to apprise the public, and more especially those interested in the particular art to which the invention relates, of the nature of the invention in order to be of assistance in aiding ready understanding of the patent in future searches.

BRIEF DESCRIPTION OF THE DRAWINGS

FIG. 5 is a schematic block diagram of a system implementation exemplary embodiment in accordance with the present invention.

Like reference designations represent like features throughout the drawings. The drawings in this specification should be understood as not being drawn to scale unless specifically annotated as such.

DETAILED DESCRIPTION OF EXEMPLARY EMBODIMENTS

In general, the present invention provides for quantum dot target constructs that may be associated with semiconductor devices for the purpose of providing each of the devices with a unique, identifiable, code or set of codes. For convenience of explanation, the present invention is described in conjunction with the fabrication of an IC chip exemplary embodiment. However, it will be recognized by those skilled in the art that the invention may be practiced in conjunction with the fabrication of any semiconductor device in which the processes are compatible with the formation of quantum dot constructs. No limitation on the scope of the invention is intended by exemplary embodiment descriptions nor should any be implied therefrom. Standard periodic table symbols and integrated circuit symbols commonly understood by those skilled in the art are used throughout the description.

Figure 1:
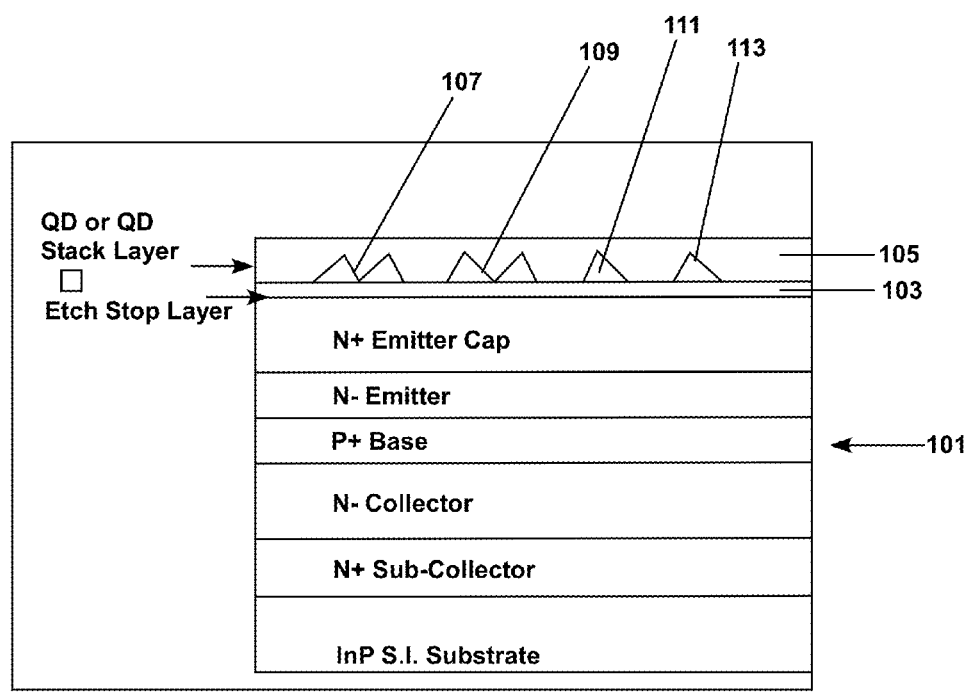
FIGS. 1 and 1A in accordance with an exemplary embodiment of the present invention is a schematic diagram depicting a starting structure and process step.

FIG. 1 depicts a first stage of fabrication of a construct in accordance with the present invention in which an exemplary semiconductor substrate 101 such as would be used to form heterojunction bipolar transistors has been formed via known manner molecular beam epitaxy. Process and structures of this type are described in a text titled "InP HBTs: Growth, Processing, and Applications," by Artech House, Norwood Mass., copyright 1995, Jalali, Peaston. ed., incorporated herein by reference. For this exemplary embodiment, a (100) InP substrate 101—such as a shown exemplary layer stack of a heterojunction bipolar transistor device—is employed. An etch stop layer 103—e.g., InP—is formed in a known manner on surface 102 of the substrate 101. Superjacent the etch stop layer 103, a quantum dot layer 105 is formed (see Background; re Bimberg and Sellin et al.).

Figure 1A:
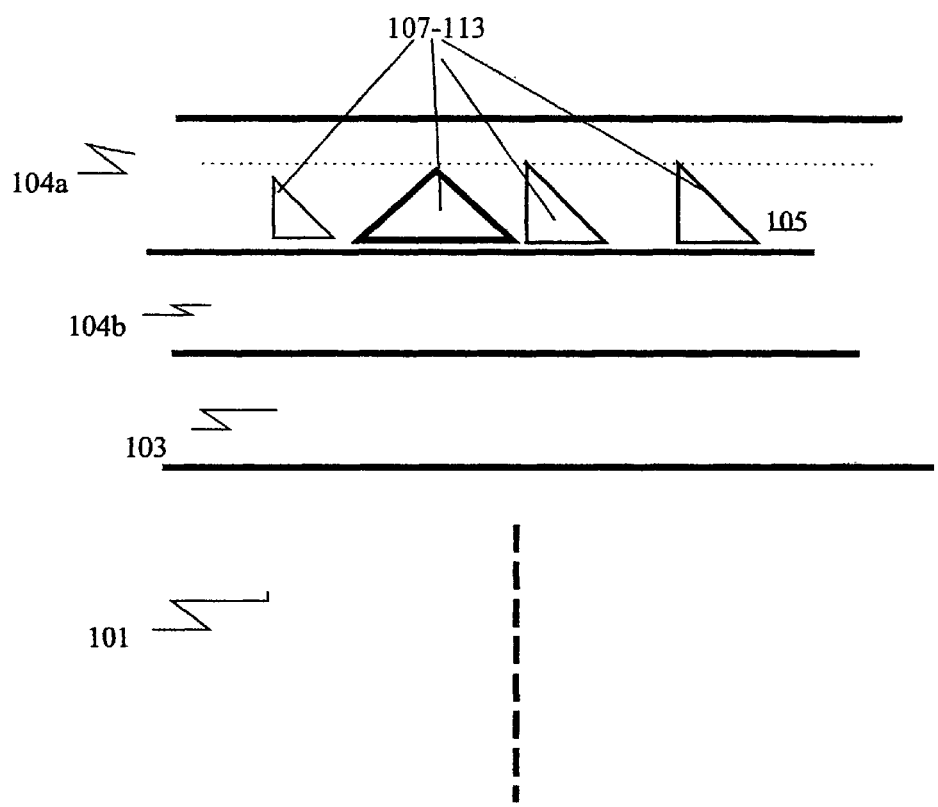

One quantum dot layer 105 is shown—depicted schematically in FIG. 1 as an idealized monolayer having a height of approximately one nanocrystal 107, 109, 111, 113. It should be recognized that providing a plurality of layers may be more practical, depending in part upon the sophistication of the methods and apparatus employed in forming the quantum dot construct and in mapping and analyzing a quantum dot regions photoluminescence spectrum code. FIG. 1A schematically depicts a quantum dot layered structure using a barrier. In an experimental exemplary embodiment, InAs quantum dot layers 105 were formed as a stack of a few monolayers 105 of InAs, embedded in InAlGaAs or GaInAsP barrier layers 104a, 104b, preferably with cap layers (not shown in these FIGs; see, Bimberg and Sellin et al., supra, regarding known manner techniques which may be employed in conjunction with the present invention). If such stacked monolayers are employed, each barrier layer 104a, 104b can be equal to or greater than 250 Angstroms. In general, other specific implementations of self-assembled, self-organized, quantum dot layer(s) for coding a device based on a distinct photoluminescence spectra characteristics of quantum dots and compatible with semiconductor processes for forming the underlying device may be selected. Moreover, specially designed vertically aligned or stacked high density quantum dot structures that are consistent with a specific semiconductor device technology can be associated in a variety of implementations.

Figure 2A:
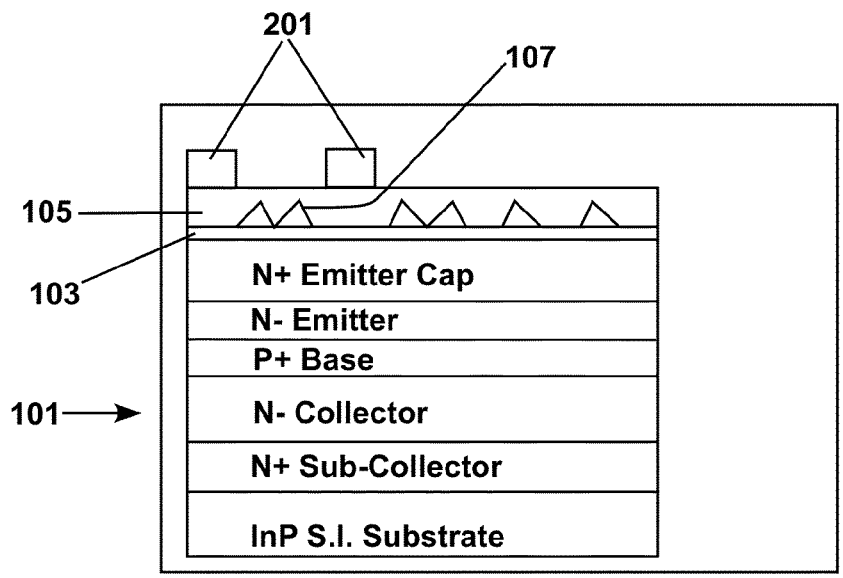
FIGS. 2a and 2b in accordance with the exemplary embodiment of FIGS. 1 and 1A depict continuing process steps and resultant structure.
Figure 2B:
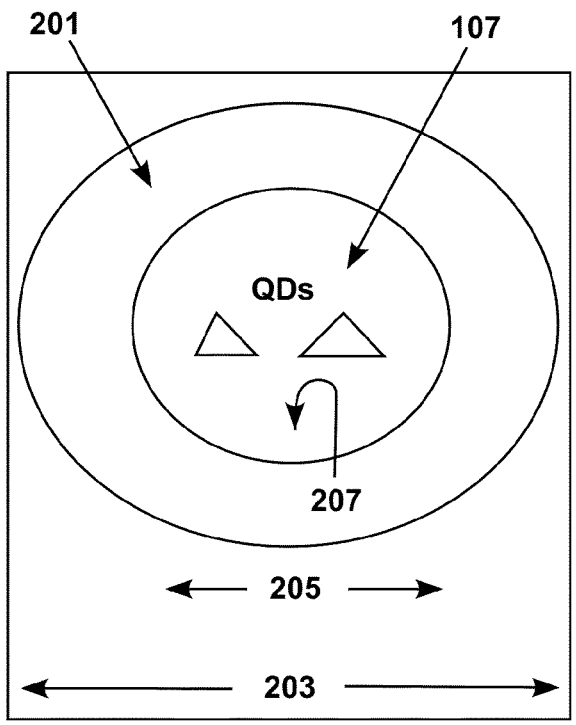

FIGS. 2a and 2b depict a next stage of fabrication and structure in which a targeting mask 201 is formed adjacent to the quantum dot layer 105. In this embodiment, the targeting mask 201 is exemplified as a metal layer ring formed in a known manner over at least one surface region of the quantum dot layer 105. An aperture 207 is formed in the targeting mask 201. The outer diameter 203 and inner diameter 205 of the ring can be determined in accordance with current photolithography or other known manner semiconductor device fabrication techniques. The aperture 207 is formed in this exemplary embodiment with an inner diameter 205 of an exemplary circular mask 201. The shapes (open or closed) and dimensions of the aperture 207 may be selected for a specific implementation such that the exposed quantum dot ("QDs") layer 105 region 107 subjacent the aperture supports the need of the photoluminescent spectrum to be mapped and analyzed for ID purposes (see FIG. 5 and related description below). This will be related to the size and density of the quantum dots which is determined by the chemistry of the materials employed in forming the quantum dot layer 105. It also should be recognized that while in this exemplary embodiment the targeting mask 201 was formed superjacent to the quantum dot layer 105, in other implementations it may be convenient to embed such a mask, forming a target where the surface of the quantum dot region and the surface of the mask are semi-planar or substantially coplanar.

Furthermore, a plurality of targeting masks 201 may be formed simultaneously, for example with respect to more than one of the quantum dot layer crystal regions 107 109, 111, and 113 as depicted in FIG. 1. It may be advantageous in some implementations to provide a set of targets—namely, a set of identity signature quantum dot target constructs—for each device to be scribed from a semiconductor wafer (not shown). In other words, each device would have a set of unique codes, analogous to a set of fingerprints in which one may be sufficient to confirm true identity. In this manner, in the event that one or more of the target constructs becomes defective or disabled, another of the constructs may still be mapped and analyzed with respect to its unique photoluminescent spectrum.

In general it is believed that the smaller the aperture 207, the sharper the photoluminescent spectrum lines will be. In this exemplary embodiment and in accordance with current state-of-the-art fabrication techniques, the inner diameter 205 of the ring is submicron. A purpose of the targeting mask 201 is to ensure repeatability in performance of the present invention. It is known that quantum dots have three dimensional confinements within dimensions smaller than their deBroglie wavelength. Narrow and specific photoluminescence emission peaks have intensities depending in part upon excitation wavelength. The targeting mask 201 ensures a more consistent illumination factor and fluorescence in that generally the same specific quantum dots will fluoresce.

Figure 3A:
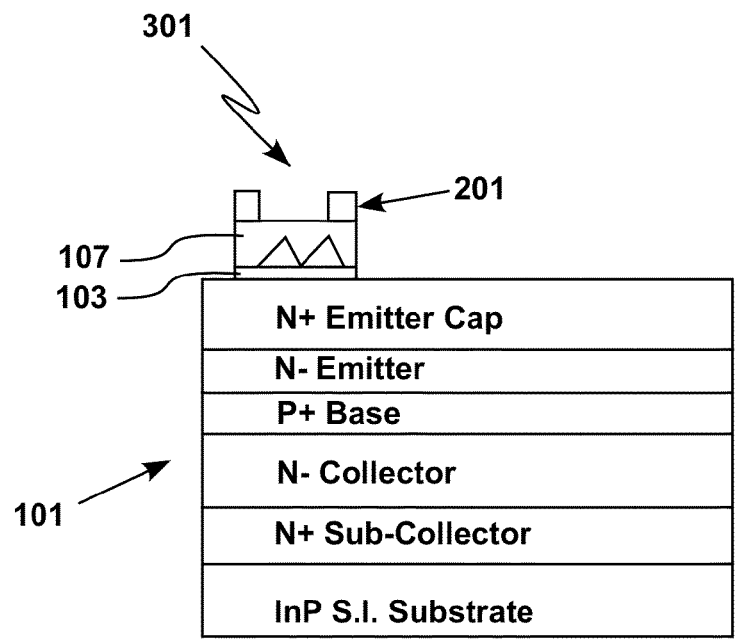
FIGS. 3a and 3b in accordance with the exemplary embodiment of FIGS. 1, 1A, 2a and 2b depict continuing process steps and resultant structure.
Figure 3B:
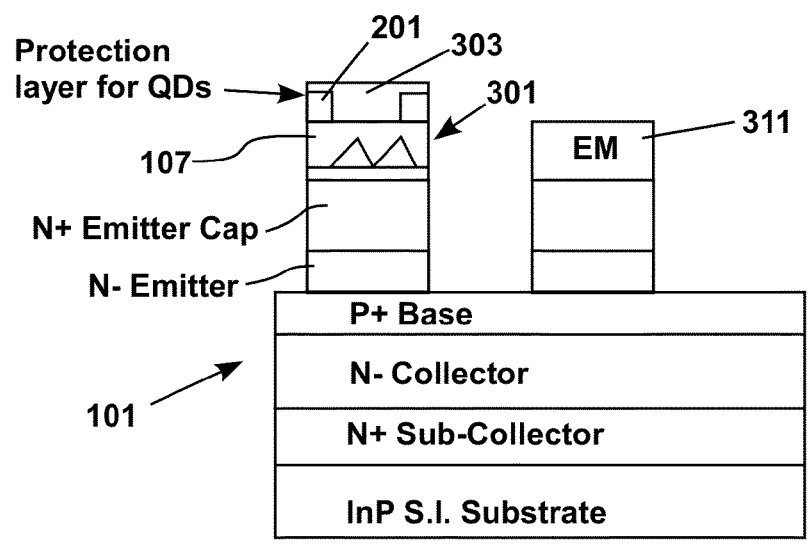

FIGS. 3a and 3b depict the formation of discrete quantum dot targets. In FIG. 3a, the unused regions of the quantum dot layer 105 have been removed, namely all volumes not subjacent targeting mask 201. For example, an inductively-coupled plasma etch (ICP: may have an end point system with optical emission intensities) using a Cl-based or methane-hydrogen based chemistry, may be employed; wet chemistry methods also may be employed. This leaves a quantum dot target 301 at one, or more, known positions on the surface of the etch stop layer 103 of the substrate 101. Note that these steps simultaneously exposed the heterojunction bipolar transistor layers (labeled) for known manner integrated circuit processing to form discrete elements therefrom. Further description of those steps are not material to an understanding of the present invention.

Turning to FIG. 3b, a target protection cap 303—such as an incoming-wavelength-transparent silicon nitride in this exemplary embodiment—is formed on top of the quantum dot target(s) 301, covering the mask and the quantum dot fluorescing surface. This protects the quantum dot target(s) 301 during the remainder of the heterojunction bipolar transistor fabrication steps. In this Figure, an exemplary emitter metal (EM) contact 311 not shown in previous Figures was formed in a known manner on top of the Emitter cap layer and discrete subjacent N-Emitter mesas were formed by known manner to expose the base layer 317. Continuing known manner steps may be used to complete the IC constructs; again, further explanation is not material to an understanding of the present invention. What is material is that the target 301 protection cap 303, when formed of silicon nitride (Si3N4), has been found to enhance performance of the present invention.

In an experimental implementation, an Si3N4 cap 303 having a thickness of approximately 500 Angstroms was grown on an Sb4122 quantum dot control material. Photoluminescence was measured from the control piece, the Si3N4 capped control piece, and a piece of bulk InAs. In comparison, the peak position appeared unchanged in the Si3N4 capped control and the intensity appeared to be increased. It is believed that the Si3N4 cap acts as an antireflective coating. Thus, the target protection cap 303 (FIG. 3b) was found by the inventors to enhance performance in the present invention. Other transparent materials, e.g., silicon dioxide (SiO2), are expected to act similarly; experimentation may yield further improvements.

Figure 4:
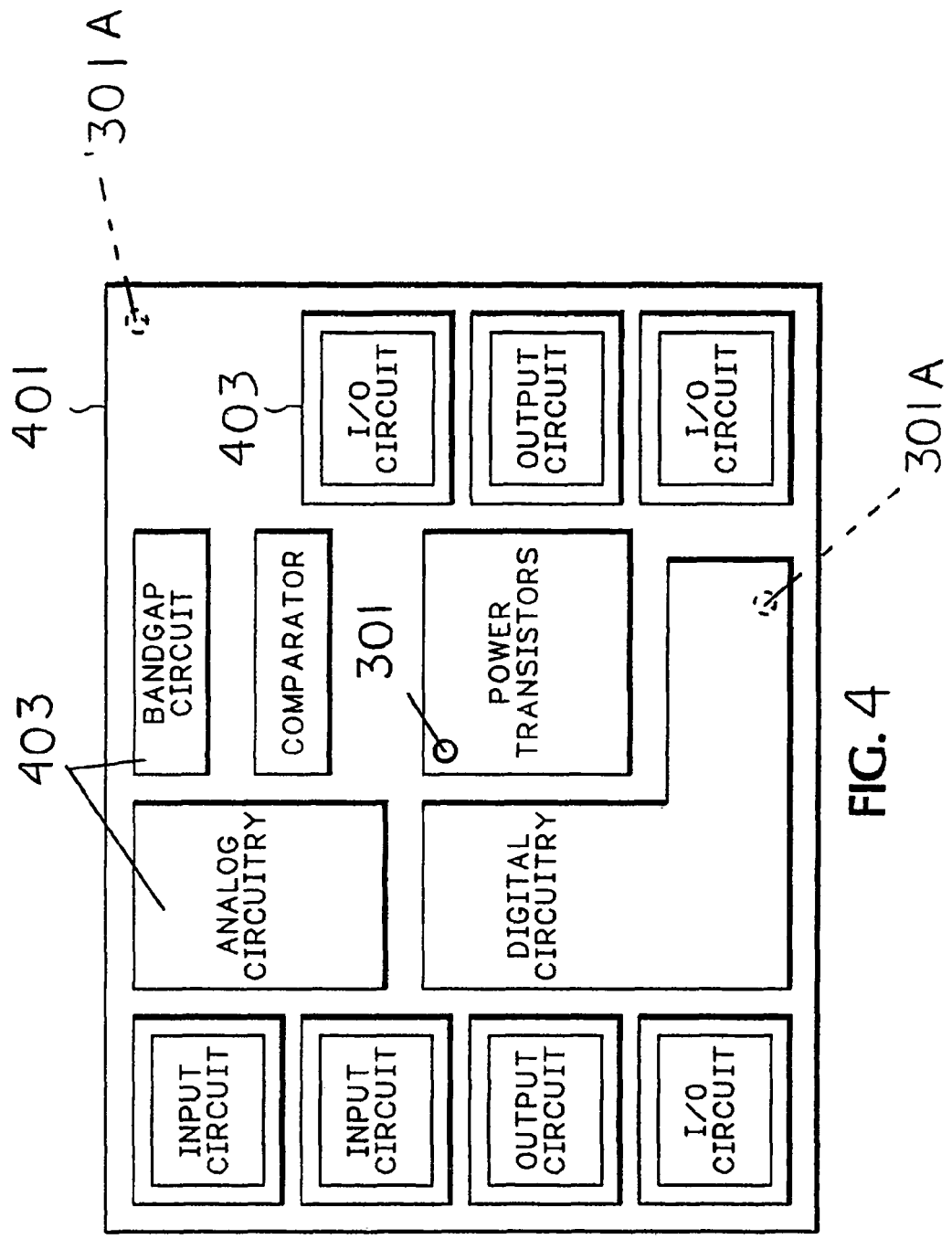
FIG. 4 is a schematic block diagram of another exemplary embodiment of the present invention; overhead view.

FIG. 4 is another implementation of an exemplary embodiment of the present invention is shown. In this aerial view, an IC chip 401 is schematically depicted, having a plurality of functional components 403 (labeled). The IC chip 401 is shown to have a quantum dot target 301. Other quantum dot targets may be fabricated, shown as phantom line circles 301A, at various locations in conformance with the processes associated with fabricating each component 403 or simultaneously for the entire chip 401. The exact location(s) of the target(s) 301, 301A with respect to other components on the chip 401 may be kept secret as a security measure. An illumination source and detector (see, FIG. 5 and detailed description below) having a narrow field-of-view will capture the fixed photoluminescence signature(s) of each target. However, it also should be recognized that high-resolution systems can be designed with end-users' input. Therefore, advancements in photoluminescence mapping systems has the potential of meeting requirements for mapping high-resolution quantum dot emission spectra.

FIG. 5 depicts a block diagram of a system for mapping and analyzing photoluminescent data from a semiconductor device 501 having at least one quantum dot target 301 thereon (three shown). An illumination source 503, such as a known manner GaAs diode is used to project light (depicted by wavy lines) narrow beam, scanning or the like, onto the device 501, impinging on each target 301, repeatably as substantially ensured by use of the targeting mask feature. Narrow and specific emission peaks with intensity depending on excitation wavelength is an important characteristic of a fluorescing quantum dot target 301. A photoluminescence mapper 505 in combination with a data processor 507 can both record location of the device 501 associated quantum dot targets 301 and map, record each map, and analyze the photoluminescence spectra, as well as intensities, line shapes, line widths, and number of peaks of photoluminescence peaks vs. wavelength.

More particularly, there are a variety of factors and characteristics making quantum dot technology highly suited to coding in accordance with the present invention. Photoluminescence wavelength is sensitive to patterns, size, height and density of quantum dot targets 301. For example, quantum dot density may make its spectrum facet dependent; some facets can be denser than others. This characteristic may allow quantum dot targets 301 with various density formed at various facets (by patterning, etching and revealing the desired facets at designated area) to be formed on same wafer. The photoluminescence spectra of the quantum dot targets 301 with various densities may be distinct from one location to another on a wafer. Photoluminescence peak energy and quantum dot crystal size distribution are found dependent strongly on the growth condition—e.g., substrate temperature, growth rate, V/III ratio, growth rate, and the like—of the layer used to form the quantum dot layers, including any barrier layers employed. Photoluminescence peak energy can depend on thickness of the dot, as well as strain and shape of the dots. Quantum dot photoluminescence peak width is generally also found related to distribution in height of the dots. Photoluminescence peak line width reduction can be obtained from smaller distribution in dot height. InAs/InP quantum dot formation, height dispersion control was found to be making photoluminescence line widths narrower. Island size reduction increases quantum confinement was found from InAs/InP quantum dots of the exemplary embodiment, demonstrated through room temperature photoluminescence spectrum analysis. Vertical electronic coupling was found between InAs/InP quantum dots grown on (113) B InP; and on closely stacked InAs/GaAs quantum dots grown at slow growth rate. Photoluminescence spectrum of ordered arrays of quantum dots is dominated by a single sharp line, while series of sharp lines indicate transitions in quantum dots of different sizes. However several sizes of dots can be combined to create an almost infinite variety of emission spectra. By changing the number of dots, their individual concentrations, their emission peaks and for their excitation wavelength, a vast code can be designed and inserted into semiconductor materials. Quite often etch-revealed planes are involved in quantum dot and quantum well structures. Lower index plane is more common. Quantum dots on higher index planes in both material systems were found of improved quantum dots size uniformity. In applications for semiconductor IC authentication selectively placed self-assembled quantum dot targets 301 on various index facets can potentially provide more intentional, controlled quantum dots density variation and hence intentional photoluminescence spectra variations from location to location. Dependence of the photoluminescence spectrum on growth parameters, as well as detailed layer structures can be found through experiments. The results can point out directions for optimizing quantum dots quality and layer structures of quantum dots part for obtaining desired/preferred photoluminescence spectra fingerprints for semiconductor device coding.

The recorded "maps" define the unique virtual "signature" or "fingerprint" of each target 301. A commercially available mapping subsystem may be employed, such as described by RPMSigma in Compound Semiconductor Magazine, product release announcement September 2005: "Accent: PL Mapping Product" and "Accent: PL Mapping Software Features." Low temperature (vs. room temperature) photoluminescence mapping systems with submicron resolution and scan area of 25×25 mm are also known and may be employed; see e.g., M. De Vittorio et al, Review of Scientific Instruments, vol. 72, no. 6, 2001, pp. 2610. Studies from III/V arsenide quantum dot constructs have demonstrated that the exciton recombination times and exciton dephasing times are in the nanosecond range and hundreds of picoseconds; much longer than needed in taking photoluminescence spectrum data.

Next, this record of quantum dot target photoluminescence spectra data is stored in a data processing subsystem 507. In other words, the stored record has become a unique signature, permanently associated with the device 501.

At a later time, the record can be accessed and a currently unidentified or suspect device placed in the system 501 can be illuminated and its photoluminescence spectra can be mapped and compared to the record to determine whether there is a match. A match-intended fingerprint will be hard to duplicate. Thus, because of its unique photoluminescence spectrum, quantum dots target(s) would enable semiconductor authentication by allowing each device to have a distinct signature based on the attached quantum dots target specific photoluminescence spectrum.

From the foregoing description, it will be apparent that the present invention has a number of advantages, some of which have been described above, and others of which are inherent in the embodiments of the invention described above. Also, it will be understood that modifications can be made to the invention described without departing from the teachings of subject matter described herein. As such, the invention is not to be limited to the described embodiments except as required by the appended claims.

The invention claimed is:

1. A system for coding a semiconductor substrate, the system comprising:
   on said substrate, at least one quantum dot target having a predetermined chemistry and emitting a substantially repeatable photoluminescence spectra;
   positioned for illuminating each said target, an illumination source having photoemissions of a predetermined wavelength associated with said predetermined chemistry for instigating said photoluminescence spectra;
   a detector positioned for receiving said photoluminescence spectra instigated by said illumination source;
   associated with said detector, a photoluminescence spectra reading and mapping subsystem for generating data records from said quantum dot photoluminescence spectra; and
   a data processor for storing maps associated with said data records and for comparing said maps to subsequently received data records associated with subsequent photoluminescence spectra emissions instigated by said illumination source.

2. The system as set forth in claim 1, said target including an opaque mask defining an aperture and a quantum dot construct having said predetermined chemistry and a fluorescing region exposed via said aperture for emitting said substantially repeatable photoluminescence spectra.

3. The system as set forth in claim 2, said target including a transparent protective cap on said region.

4. The system as set forth in claim 3 wherein said cap is formed of a material enhancing photoluminescence from said region.

5. The system as set forth in claim 1 wherein said target is compatible with processes forming active elements of a semiconductor device in and on said substrate.

6. The system as set forth in claim 5 wherein said target is formed in conjunction with said processes forming active elements.

7. The system as set forth in claim 1 wherein each said target on said substrate has a substantially unique photoluminescence spectrum and at least one spectrum or any combination of said spectrums form a unique identifier code for said substrate.

8. A method for forming a quantum dot coding apparatus on a semiconductor device having a given substrate using known manner fabrication processes associated with the chemistry of said given substrate, the method having steps comprising:
   forming an etch stop layer across an active element surface of said substrate;
   forming a semiconductor nanocrystal layer comprising quantum dots superjacent said etch stop layer;
   forming at least one targeting mask superjacent said semiconductor nanocrystal layer;
   removing regions of said nanocrystal layer not subjacent each targeting mask;
   forming a via in said targeting mask, exposing a surface region of said nanocrystal layer; and
   forming a passivation layer superjacent said targeting mask and said surface region of said nanocrystal layer,
   wherein said mask and surface region of said nanocrystal layer form a target for impinging light for causing photoluminescence spectral emissions from said surface region of said nanocrystal layer through said via, and
   wherein said passivation layer protects said target from subsequent process for forming active elements of said semiconductor device in said substrate.

9. The method as set forth in claim 8 wherein the step of forming a passivation layer includes forming said passivation layer from a transparent material.

10. The method as set forth in claim 9 comprising:
- completing of formation of all active elements of said semiconductor device; and
- forming a transparent interlayer dielectric for planarization and passivation of said semiconductor device, leaving electrodes exposed.

* * * * *